United States Patent
Nishizawa et al.

(10) Patent No.: US 10,784,835 B2
(45) Date of Patent: *Sep. 22, 2020

(54) VIBRATION DEVICE, ELECTRONIC APPARATUS, AND VEHICLE

(71) Applicant: SEIKO EPSON CORPORATION, Tokyo (JP)

(72) Inventors: Ryuta Nishizawa, Nagano (JP); Shiro Murakami, Shiojiri (JP); Shinya Aoki, Minowa-Machi (JP); Atsushi Matsuo, Shiojiri (JP); Masashi Shimura, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/202,870

(22) Filed: Nov. 28, 2018

(65) Prior Publication Data

US 2019/0165759 A1 May 30, 2019

(30) Foreign Application Priority Data

Nov. 29, 2017 (JP) ................................. 2017-228725

(51) Int. Cl.
*H03H 9/05* (2006.01)
*H03H 9/19* (2006.01)
(Continued)

(52) U.S. Cl.
CPC ....... *H03H 9/0538* (2013.01); *G01C 19/5621* (2013.01); *G01C 19/5783* (2013.01); *H01L 24/13* (2013.01); *H01L 41/047* (2013.01); *H03B 5/32* (2013.01); *H03H 9/0519* (2013.01); *H03H 9/0547* (2013.01); *H03H 9/09* (2013.01); *H03H 9/1021* (2013.01); *H03H 9/19* (2013.01); *H01L 24/16* (2013.01); *H01L 24/81* (2013.01); *H01L 2224/13* (2013.01);
(Continued)

(58) Field of Classification Search
CPC .. H03H 9/0538; H03H 9/1021; H03H 9/0519; G01C 19/583; H01L 41/047; H03B 5/32
See application file for complete search history.

(56) References Cited

U.S. PATENT DOCUMENTS 7,135,810 B2 * 11/2006 Okajima ............... H03H 9/0552
310/348
7,602,107 B2 * 10/2009 Moriya ................ H03H 9/0547
29/594

(Continued)

FOREIGN PATENT DOCUMENTS

JP 2009-239475 A 10/2009
JP 2010-141415 A 6/2010
(Continued)

*Primary Examiner* — Jeffery M Shin
(74) *Attorney, Agent, or Firm* — Oliff PLC

(57) ABSTRACT

A vibration device including a vibrator, a circuit component, a relay substrate disposed between the vibrator and the circuit component, a package that accommodates the vibrator, the circuit component, and the relay substrate, a first metal bump that joins the circuit component to the package, a second metal bump that joins the relay substrate to the circuit component, and a third metal bump that joins the vibrator to the relay substrate.

10 Claims, 11 Drawing Sheets

(51) Int. Cl.
*H01L 41/047* (2006.01)
*G01C 19/5621* (2012.01)
*H01L 23/00* (2006.01)
*H03B 5/32* (2006.01)
*H03H 9/10* (2006.01)
*G01C 19/5783* (2012.01)
*H03H 9/09* (2006.01)

(52) U.S. Cl.
CPC ............... *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13169* (2013.01); *H01L 2224/16145* (2013.01); *H01L 2224/16225* (2013.01); *H01L 2224/81203* (2013.01); *H01L 2224/81207* (2013.01); *H01L 2924/15311* (2013.01); *H01L 2924/16195* (2013.01)

(56) References Cited

U.S. PATENT DOCUMENTS

| | | | |
|---|---|---|---|
| 2006/0055479 A1* | 3/2006 | Okazaki | H03B 5/32 331/158 |
| 2009/0023400 A1* | 1/2009 | Nishio | H03B 5/36 455/91 |
| 2009/0230486 A1* | 9/2009 | Shimodaira | H03H 9/0547 257/415 |
| 2019/0199317 A1* | 6/2019 | Matsuo | H03H 9/0514 |

FOREIGN PATENT DOCUMENTS

| | | |
|---|---|---|
| JP | 2010-166626 A | 7/2010 |
| JP | 2012-134792 A | 7/2012 |

* cited by examiner

VIBRATION DEVICE, ELECTRONIC APPARATUS, AND VEHICLE

BACKGROUND

1. Technical Field

The present invention relates to a vibration device, an electronic apparatus, and a vehicle.

2. Related Art

There is a known vibration device including a vibrator and a circuit component, and a representative example of such a vibration device is, for example, a quartz crystal oscillator. For example, the surface mounting quartz crystal oscillator described in JP-A-2012-134792 includes a quartz crystal vibrator element, an integrated circuit component, a base on which the quartz crystal vibrator element and the integrated circuit component are disposed and by which they are held, and a lid joined to the base to hermetically encapsulate the quartz crystal vibrator element and the integrated circuit component. The integrated circuit component is joined to the base and the quartz crystal vibrator element via metal bumps.

In the surface mounting quartz crystal oscillator described in JP-A-2012-134792, however, since the quartz crystal vibrator element and the integrated circuit component are joined to each other via the metal bumps, the stress induced in the quartz crystal vibrator element increases due, for example, to the difference in the coefficient of linear expansion between the quartz crystal vibrator element and the integrated circuit component, resulting in a problem of deterioration of the frequency-temperature characteristics and other factors. Further, in a case where the quartz crystal vibrator element and the integrated circuit component are joined to each other via a known electrically conductive resin, outgassing from the resin undesirably causes the problem of deterioration of the frequency characteristics.

SUMMARY

An advantage of some aspects of the invention is to provide a vibration device that allows a vibrator and a circuit component to be incorporated in a package with use of no resin material with stress induced in the vibrator suppressed. Another advantage of some aspects of the invention is to provide an electronic apparatus and a vehicle including the vibration device.

The invention can be implemented as the following application examples or forms.

A vibration device according to an application example includes a vibrator, a circuit component, a relay substrate disposed between the vibrator and the circuit component, a package that accommodates the vibrator, the circuit component, and the relay substrate, a first metal bump that joins the circuit component to the package, a second metal bump that joins the relay substrate to the circuit component, and a third metal bump that joins the vibrator to the relay substrate.

According to the vibration device described above, since the vibrator is supported by the circuit component via the relay substrate, stress induced in the vibrator can be reduced even in the situation in which the first to third metal bumps are used. Further, the vibrator and the circuit component can be incorporated in the package with use of no resin material but use of the metal bumps. Therefore, even in a case where the package is sealed and then undergoes a heat treatment, a problem of a gas produced from a resin material (outgassing) in the package can be solved.

In the vibration device according to the application example, it is preferable that the second metal bump does not overlap with the first metal bump when viewed in a thickness direction of the relay substrate.

The stress induced in the vibrator can thus be further reduced.

In the vibration device according to the application example, it is preferable that the second metal bump does not overlap with the third metal bump when viewed in a thickness direction of the relay substrate.

The stress induced in the vibrator can thus be further reduced.

In the vibration device according to the application example, it is preferable that the first and second metal bumps are arranged at an active surface of the circuit component.

The configuration described above eliminates the need to provide the circuit component with Si pass-through electrodes or any other structure, whereby the cost of the circuit component can be reduced.

In the vibration device according to the application example, it is preferable that the first and second metal bumps are so disposed that one of the metal bumps is arranged at an active surface of the circuit component and the other is arranged at a surface opposite from the active surface of the circuit component.

With this configuration, when the circuit component and the relay substrate are incorporated in the package, the circuit component and the relay substrate can be layered on each other on the same side, whereby the circuit component and the relay substrate can be readily incorporated in the package, which is an advantage provided by the present application embodiment.

In the vibration device according to the application example, it is preferable that the second metal bump is disposed on one surface of the relay substrate, and that the third metal bump is disposed on another surface of the relay substrate.

With this configuration, when the relay substrate and the vibrator are incorporated in the package, the relay substrate and the vibrator can be layered on the same side of the circuit component, whereby the circuit component, the relay substrate, and the vibrator can be readily incorporated in the package, which is an advantage provided by the present application embodiment.

In the vibration device according to the application example, it is preferable that the relay substrate includes a frame-shaped first section, a third section disposed inside the first section, and a first beam section that supports the third section pivotally around a first axis relative to the first section, the second metal bump is disposed on the first section, and the third metal bump is disposed on the third section.

The stress induced in the vibrator can thus be further reduced.

In the vibration device according to the application example, it is preferable that the relay substrate includes a frame-shaped first section, a frame-shaped second section disposed inside the first section, a third section disposed inside the second section, and a first beam section that supports the second section pivotally around a first axis relative to the first section, and a second beam section that supports the third section pivotally around a second axis that intersects the first axis relative to the second section, the second metal bump is disposed on the first section, and the third metal bump is disposed on the third section.

The stress induced in the vibrator can thus be further reduced.

An electronic apparatus according to an application example includes the vibration device according to the application example.

The electronic apparatus described above can use the excellent characteristics of the vibration device to improve the characteristics of the electronic apparatus.

A vehicle according to an application example includes the vibration device according to the application example.

The vehicle described above can use the excellent characteristics of the vibration device to improve the characteristics of the vehicle.

BRIEF DESCRIPTION OF THE DRAWINGS

The invention will be described with reference to the accompanying drawings, wherein like numbers reference like elements.

DESCRIPTION OF EXEMPLARY EMBODIMENTS

A vibration device, an electronic apparatus, and a vehicle according to preferable embodiments of the invention will be described below in detail with reference to the drawings.

1. Vibration Device

First Embodiment

Figure 1:
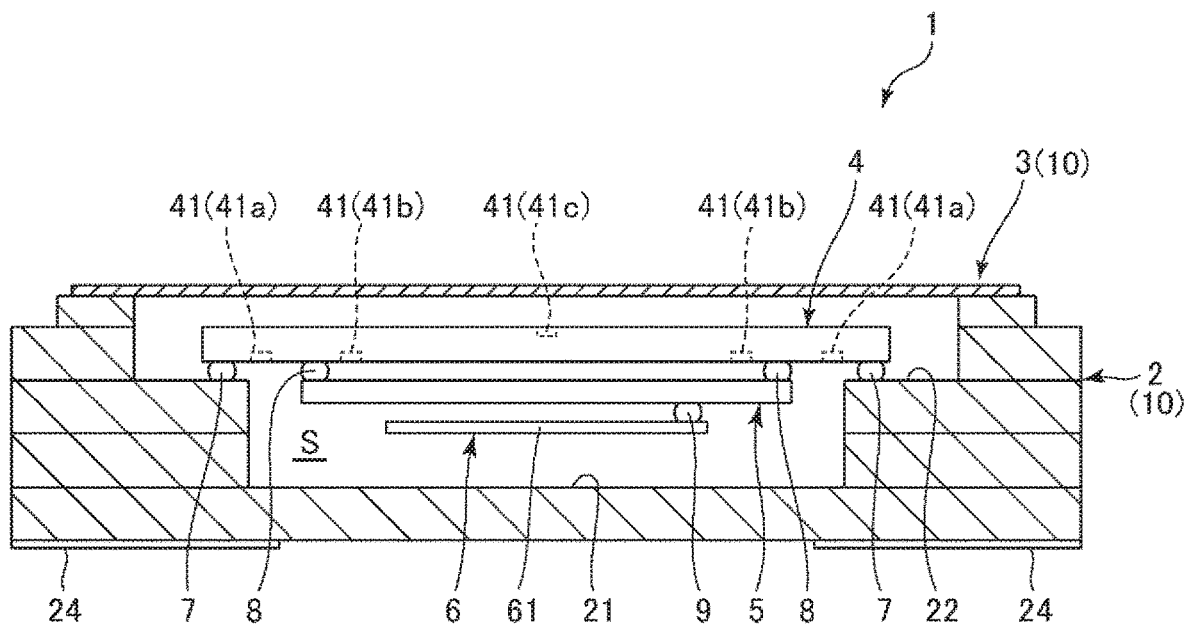
FIG. 1 is a longitudinal cross-sectional view (cross-sectional view taken along plane αγ) showing a vibration device (oscillator) according to a first embodiment of the invention.
Figure 1:
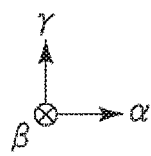
Figure 2:
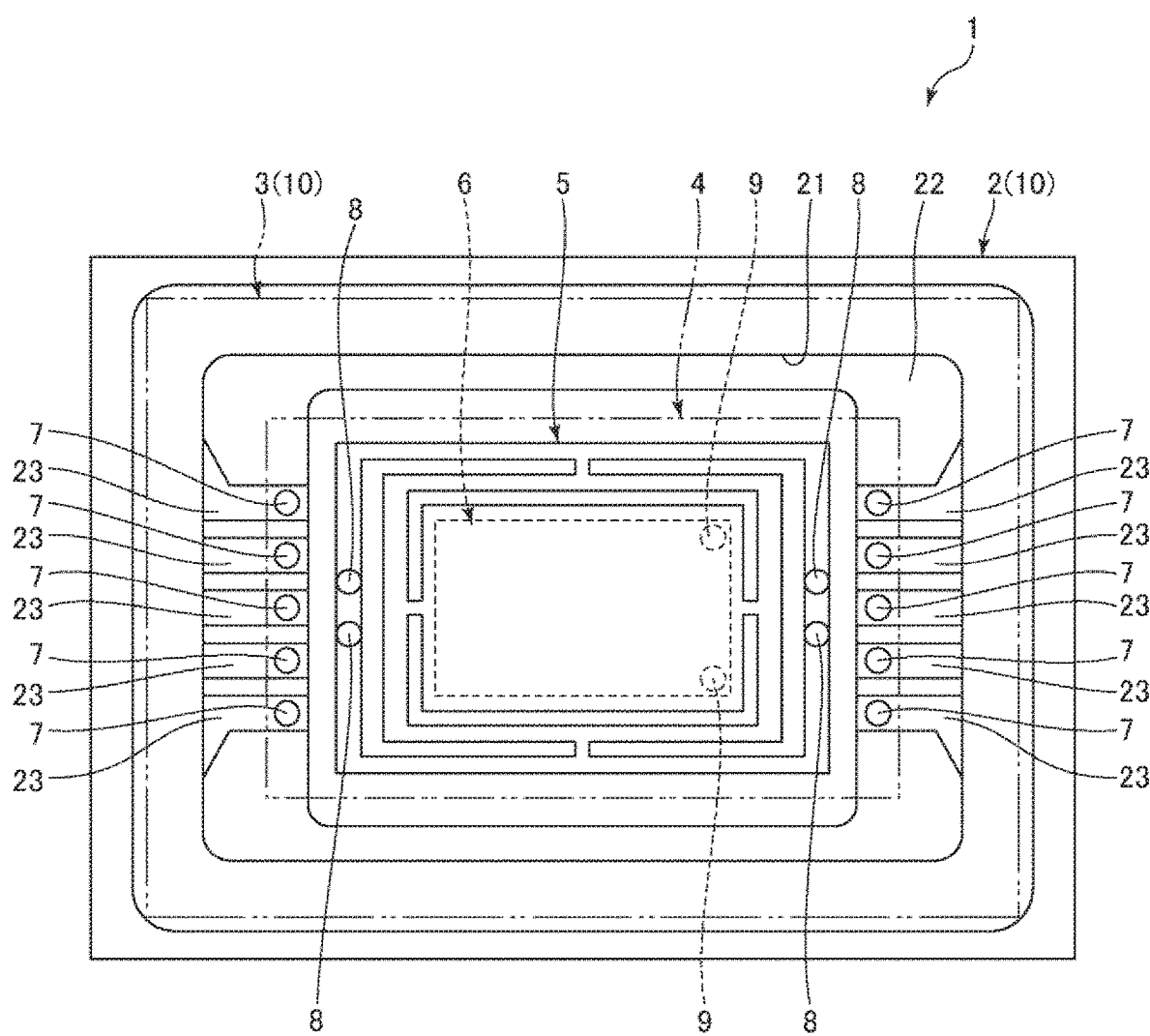
FIG. 2 is a plan view of the vibration device shown in FIG. 1 (viewed from +γ-direction side).
Figure 3:
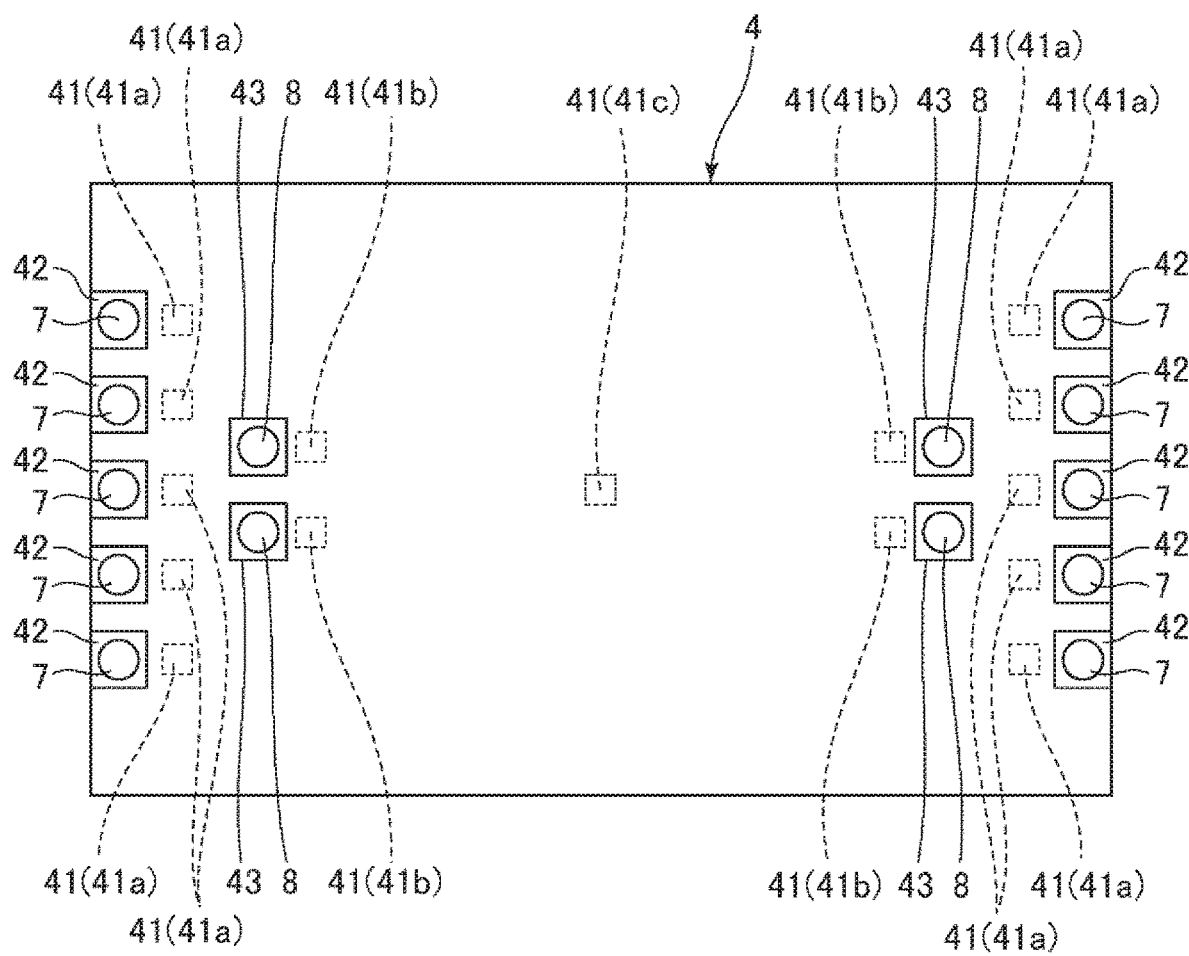
FIG. 3 is a plan view of a circuit component provided in the vibration device shown in FIG. 1 (viewed from −γ-direction side).
Figure 3:
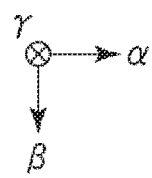
Figure 4:
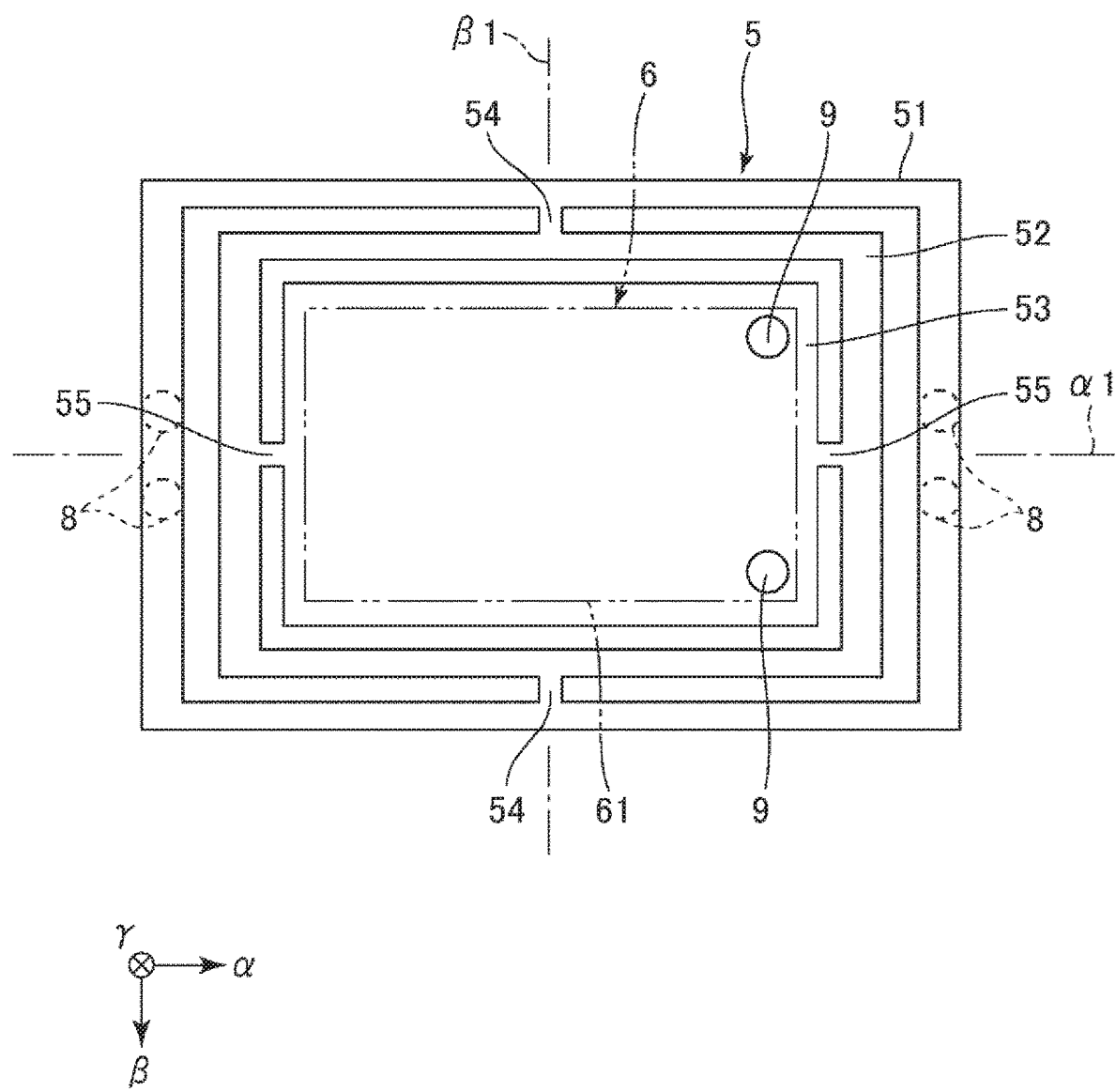
FIG. 4 is a plan view of a relay substrate provided in the vibration device shown in FIG. 1 (viewed from −γ-direction side).
Figure 5:
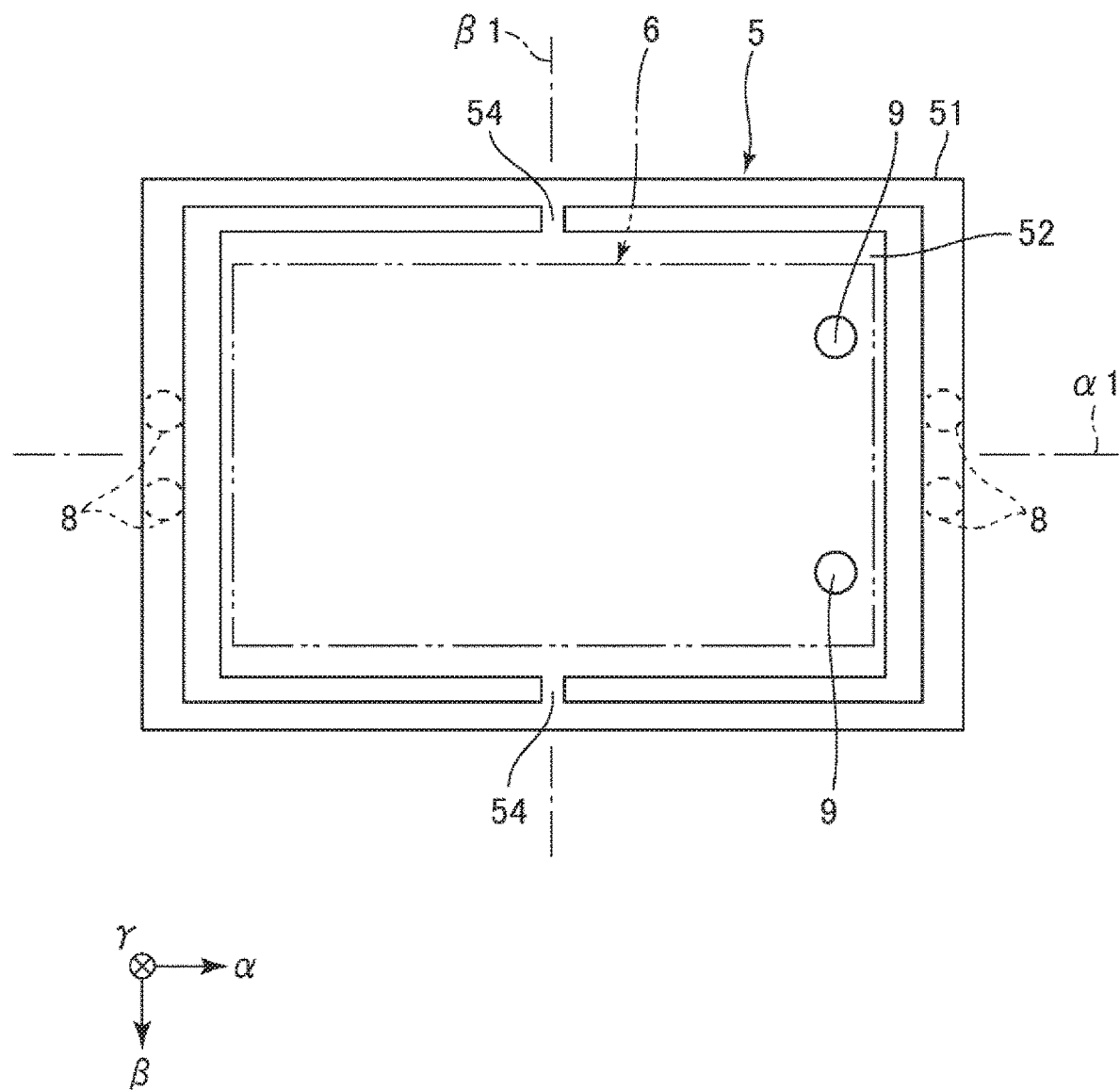
FIG. 5 is a plan view showing Variation 1 of the relay substrate (viewed from −γ-direction side).
Figure 6:
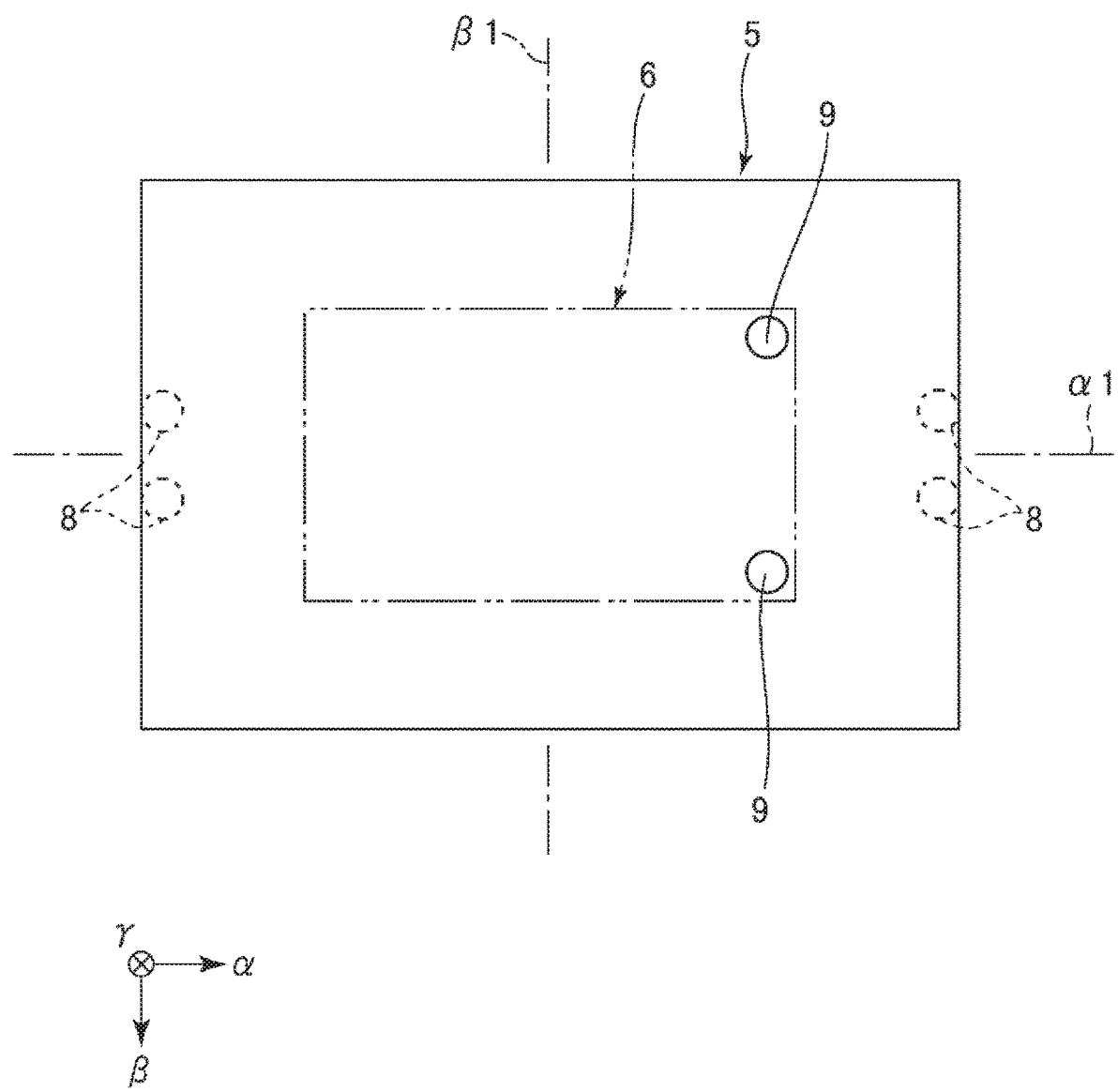
FIG. 6 is a plan view showing Variation 2 of the relay substrate (viewed from −γ-direction side).

FIG. 1 is a longitudinal cross-sectional view (cross-sectional view taken along plane αγ) showing a vibration device (oscillator) according to a first embodiment of the invention. FIG. 2 is a plan view of the vibration device shown in FIG. 1 (viewed from +γ-direction side). FIG. 3 is a plan view of a circuit component provided in the vibration device shown in FIG. 1 (viewed from −γ-direction side). FIG. 4 is a plan view of a relay substrate provided in the vibration device shown in FIG. 1 (viewed from −γ-direction side). FIG. 5 is a plan view showing Variation 1 of the relay substrate (viewed from −γ-direction side). FIG. 6 is a plan view showing Variation 2 of the relay substrate (viewed from −γ-direction side).

The following description will be made by using, as appropriate, axes α, β, and γ, which are three axes perpendicular to one another, for ease of description. In the following description, the direction parallel to the axis α is called a "direction α," the direction parallel to the axis β is called a "direction β," and the direction parallel to the axis γ is called a "direction γ." Further, in the following figures, the side facing the front end of the arrow representing any of the axes α, β, and γ is a "+" side, and the side facing the base end of the arrow is a "−" side. The upper side in FIG. 1 (+γ-direction side) is also called "upper," and the lower side in FIG. 1 (−γ-direction side) is also called "lower." Further, the view along the direction γ is also called a "plan view." FIG. 2 is a see-through view of the interior of a base 2 viewed through a lid 3 for ease of description.

A vibration device 1 shown in FIG. 1 is a quartz crystal oscillator. The vibration device 1 includes a base 2 (base element), a lid 3, a circuit component 4, a relay substrate 5, a vibrator 6, and metal bumps 7, 8, and 9.

The base 2 and the lid 3 form a package 10 having a space S, which accommodates the circuit component 4, the relay substrate 5, and the vibrator 6. In the space S in the package 10, the circuit component 4, the relay substrate 5, and the vibrator 6 are arranged (layered on each other) in the presented order from the +γ-direction side toward the −γ-direction side.

The metal bumps 7 (first metal bump) join the base 2 and the circuit component 4 to each other, and the circuit component 4 is supported by the base 2 via the metal bumps 7. The metal bumps 8 (second metal bump) join the circuit component 4 and the relay substrate 5 to each other, and the relay substrate 5 is supported by the circuit component 4 via the metal bumps 8. The metal bumps 9 (third metal bump) join the relay substrate 5 and the vibrator 6 to each other, and the vibrator 6 is supported by the relay substrate 5 via the metal bumps 9.

The vibrator 6 and the circuit component 4 can thus be incorporated in the package 10 with use of no resin material but use of the metal bumps 7, 8, and 9. Therefore, even in a case where the package 10 is sealed and then undergoes a heat treatment, a problem of a gas produced from a resin material (outgassing) in the package 10 can be solved. Further, since the vibrator 6 is supported by the circuit component 4 via the relay substrate 5, stress induced in the vibrator 6 can be reduced even in the situation in which the metal bumps are used. Each portion of the thus configured vibration device 1 will be described below.

Package

The package 10 includes the base 2, which has a box-like shape and has a recessed section 21, which opens upward, and the lid 3, which has a plate-like shape, is joined to the base 2, and closes the opening (upper opening) of the recessed section 21, and the space S, which accommodates the circuit component 4, the relay substrate 5, and the vibrator 6, is formed as a hermetic space between the base 2 and the lid 3. The space S may have a reduced-pressure (vacuum) state or may be filled with nitrogen, helium, argon, or any other inert gas.

The base 2 is not necessarily made of a specific material and may be made of an insulating material appropriate enough to achieve the hermetic space S, for example, alumina, silica, titania, zirconia, or any other oxide-based ceramic material, silicon nitride, aluminum nitride, titanium nitride, or any other nitride-based ceramic material, silicon carbide or any other carbide-based ceramic material, or any of a variety of other ceramic materials.

The base 2 includes a stepped section 22, which is so provided in a position above the bottom surface of the recess section 21 as to surround the outer circumference of the bottom surface of the recess section 21. The upper surface of the stepped section 22 is provided with a plurality of (10 in FIG. 2) connection electrodes 23 electrically connected to the circuit component 4, as shown in FIG. 2. The connection electrodes 23 are electrically connected to a plurality of respective externally mounted electrodes 24 (see FIG. 1) provided on the lower surface of the base 2 via pass-through electrodes (not shown) that pass through the base 2.

The connection electrodes 23, the externally mounted electrodes 24, and the pass-through electrodes are not each necessarily made of a specific material and can be made, for example, of gold (Au), a gold alloy, platinum (Pt), aluminum (Al), an aluminum alloy, silver (Ag), a silver alloy, chromium (Cr), a chromium alloy, nickel (Ni), copper (Cu), molybdenum (Mo), niobium (Nb), tungsten (W), iron (Fe), titanium (Ti), cobalt (Co), zinc (Zn), zirconium (Zr), or any other metal material.

The lid 3 is joined to the upper end surface of the thus configured base 2, for example, by seam welding. A seal ring or any other joint member for joining the base 2 and the lid 3 to each other may be interposed therebetween. The lid 3 is not necessarily made of a specific material and is preferably made of a metal material. Among metal materials, the lid 3 is preferably made of a metal material having a coefficient of linear expansion close to that of the material of which the base 2 is made. Therefore, for example, in the case where the base 2 is a ceramic substrate, the lid is preferably made of Kovar or any other alloy.

Circuit Component

The circuit component 4 is an integrated circuit component having the function of driving the vibrator 6 to cause it to oscillate and the function of correcting the frequency-temperature characteristics of the oscillation frequency of the vibrator 6. The circuit component 4 includes a plurality of temperature sensors 41, a plurality of terminals 42, a plurality of terminals 43, a drive circuit (not shown), and a temperature compensation circuit (not shown). The circuit component 4 is so configured that the drive circuit drives the vibrator 6 to cause the vibrator 6 to oscillate and output a desired frequency signal. Further, the circuit component 4 corrects the frequency-temperature characteristics of the output signal from the circuit component 4 in accordance with output signals from the temperature sensors 41.

The plurality of terminals 42 and the plurality of terminals 43 shown in FIG. 3 are disposed on the lower surface of the circuit component 4 (surface on lower side in FIG. 1), which is an active surface thereof. The plurality of terminals 42 are terminals connected to the plurality of connection electrodes 23 on the base 2 described above and are provided in correspondence with the plurality of connection electrodes 23. The plurality of terminals 42 are arranged in the direction β along end portions of the circuit component 4 that are on opposite sides in the direction α, as shown in FIG. 3. The plurality of terminals 42 are joined to the corresponding connection electrodes 23 via the metal bumps 7. The configuration described above allows the circuit component 4 to be supported by the base 2 and electrically connected to the base 2. The plurality of terminals 43 are terminals for connecting the circuit component 4 to the relay substrate 5 and include terminals electrically connected via the relay substrate 5 to a pair of excitation electrodes (pad electrodes) of the vibrator 6, which will be described later. The plurality of terminals 43 are arranged in the region inside the plurality of terminals 42 and in the direction β along end portions of the circuit component 4 that are on opposite sides in the direction α, as shown in FIG. 3. The plurality of terminals 43 are joined to the relay substrate 5 via the metal bumps 8. The configuration described above allows the relay substrate 5 to be supported by the circuit component 4 and electrically connected to the circuit component 4.

The plurality of temperature sensors 41 are disposed in positions different from one another on the circuit component 4 in the plan view, as shown in FIG. 3. The plurality of thus disposed temperature sensors 41 can be used to detect the in-plane-direction distribution of the temperature of the circuit component 4. The plurality of temperature sensors 41 include a plurality of temperature sensors 41a and a plurality of temperature sensors 41b disposed on the lower surface (active surface) of the circuit component 4 and a temperature sensor 41c disposed on the upper surface of the circuit component 4. Providing the temperature sensors 41 on the opposite surfaces of the circuit component 4 as described above also allows the plurality of temperature sensors 41 to detect the thickness-direction distribution of the temperature of the circuit component 4. The temperature sensor 41c, which is disposed on a side of the circuit component 4 that is the side opposite the active surface, is, for example, a thin-film thermistor.

The plurality of temperature sensors 41a are provided in correspondence with the plurality of terminals 42 or the plurality of metal bumps 7 described above. The temperature sensors 41a are so disposed in the vicinity of the corresponding terminals 42 or metal bumps 7 (positions closer to the corresponding terminals 42 or metal bumps 7 than to the other terminals or metal bumps) as to be capable of detecting the temperatures of the corresponding terminals 42 or metal bumps 7.

The plurality of temperature sensors 41b are provided in correspondence with the plurality of terminals 43 or the plurality of metal bumps 8 described above. The temperature sensors 41b are so disposed in the vicinity of the corresponding terminals 43 or metal bumps 8 (positions closer to the corresponding terminals 43 or metal bumps 8 than to the other terminals or metal bumps) as to be capable of detecting the temperatures of the corresponding terminals 43 or metal bumps 8.

The temperature sensor 41c is disposed in a central portion of the circuit component 4 in the plan view. The temperature sensor 41c is disposed in a position closest to the lid 3 among the other plurality of temperature sensors 41. The temperature sensor 41c can therefore be used to preferably detect a change in the temperature of the circuit component 4 due to heat from the lid 3.

The arrangement of the temperature sensors 41 shown in FIG. 3 is presented by way of example and is not limited thereto. For example, in FIG. 3, the temperature sensors 41a are so arranged as not to overlap with the corresponding terminals 42 or metal bumps 7 in the plan view and may instead be so arranged as to overlap with the corresponding terminals 42 or metal bumps 7. Similarly, the temperature sensors 41b may instead be so arranged as to overlap with the corresponding terminals 43 or metal bumps 8 in the plan view. The circuit component 4 may be provided with an arbitrary number of temperature sensors 41, and part of the plurality of temperature sensors 41 described above may be omitted, or another temperature sensor may be added to the circuit component 4. The temperature sensor 41c is disposed in a central portion of the circuit component 4 in the plan view, but not necessarily, and may, for example, be so disposed as to overlap with any of the temperature sensors 41a or 41b in the plan view.

Relay Substrate

The relay substrate 5 is joined to the lower surface of the circuit component 4 described above (−γ-direction-side surface) via the plurality of metal bumps 8, as shown in FIG. 1. The vibrator 6 is joined via the metal bumps 9 to a surface of the relay substrate 5 that is the surface opposite the circuit component 4. Wiring lines (not shown) provided in correspondence with the pair of excitation electrodes (pad electrodes) of the vibrator 6, which will be described later, are disposed in the relay substrate 5, and the corresponding metal bumps 8 and 9 are connected to each other via the wiring lines.

The relay substrate 5 in the present embodiment includes a frame-shaped first section 51, a frame-shaped second section 52, which is disposed inside the first section 51, a third section 53, which is disposed inside the second section 52, first beam sections 54, which support the second section 52 pivotally around a first axis β1 relative to the first section 51, and second beam sections 55, which support the third section 53 pivotally around a second axis α1, which intersects the first axis β1, relative to the second section 52. The first section 51, the second section 52, the third section 53, the first beam sections 54, and the second beam sections 55 are integrated with one another.

The first section 51 has an oblong shape so shaped that the outer and inner circumferences thereof each have a longitudinal direction that coincides with the direction α in the plan view, and the first section 51 is so disposed as to overlap with the plurality of terminals 43 on the circuit component 4. The second section 52 is so shaped that the outer and inner circumferences thereof extend along the inner circumference of the first section 51 (that is, has oblong shape) in the plan view, and the second section 52 is so disposed inside the first section 51 as to be separate from the first section 51. The third section 53 is so shaped that the outer circumference thereof extends along the inner circumference of the second section 52 (that is, has oblong shape) in the plan view, and the third section 53 is so disposed inside the second section 52 as to be separate from the second section 52. The first beam sections 54 are disposed between the first section 51 and the second section 52 in the plan view, have a shape extending along the first axis β1, and connect the first section 51 and the second section 52 to each other. The second beam sections 55 are disposed between the second section 52 and the third section 53 in the plan view, have a shape extending along the second axis α1, and connect the second section 52 and the third section 53 to each other.

The relay substrate 5 is therefore so configured that the second section 52 is pivotable around the first axis β1 relative to the first section 51 when the first beam sections 54 are elastically deformed and the third section 53 is pivotable around the second axis α1 relative to the second section 52 when the second beam sections 55 are elastically deformed. The third section 53 is therefore pivotable around both the first axis β1 and the second axis α1 relative to the first section 51. The circuit component 4 is joined to the first section 51 via the metal bumps 8, whereas the vibrator 6 is joined to the third section 53 via the metal bumps 9. The configuration described above can further reduce the stress induced in the vibrator 6. Further, the vibration from the package 10 is unlikely to be transmitted to the vibrator 6. As a result, the anti-vibration characteristics of the vibration device 1 can also be improved.

The shapes of the sections of the relay substrate 5 are not limited to those shown in FIG. 4. For example, the outer and inner circumferences of each of the first section 51, the second section 52, and the third section 53 in the plan view may each have a square shape, a hexagonal shape, or any other polygonal shape. The first beam sections 54 and the second beam sections 55 may each be bent or branched at a halfway position thereon or may each be disposed in a position shifted from the first axis β1 or the second axis α1. Further, the relay substrate 5 may not have the gimbal shape. For example, the second beam sections 55 described above may be omitted, and the second section 52 and the third section 53 may be integrated with each other into a single plate-shaped section, as shown in FIG. 5. Still instead, the relay substrate 5 may have a single-plate-like shape, as shown in FIG. 6.

The width of the first beam sections 54 and the second beam sections 55 is preferably smaller than the thickness of the relay substrate 5. As a result, the stress induced in the vibrator 6 can be preferably reduced.

The thickness of the relay substrate 5 varies depending on the shape of the relay substrate 5 in the plan view and is not limited to a specific value. It is, however, preferable that the relay substrate 5 is thicker than the vibrator 6 but thinner than the circuit component 4. More specifically, the relay substrate 5 is preferably 1.5 times thicker than or equal to the vibrator 6 or 0.8 times thinner than or equal to the circuit component 4. As a result, the stress induced in the vibrator 6 can be preferably reduced.

The thus configured relay substrate 5 is not necessarily made of a specific material and is preferably made of a material having a coefficient of linear expansion close to that of the material of which the vibrator 6 is made. Specifically, the relay substrate 5 is preferably made of quartz crystal. The stress induced in the vibrator 6 due to the difference in the coefficient of linear expansion between the relay substrate 5 and the vibrator 6 can thus be reduced. In particular, in the case where the relay substrate 5 is made of quartz crystal, the relay substrate 5 preferably has a plate-like shape that spreads in a plane XY specified by an axis Y (mechanical axis) and an axis X (electrical axis), which are crystal axes of the quartz crystal substrate, and has a thickness in an axis Z (optical axis). That is, the relay substrate 5 is preferably formed of a Z cut quartz crystal plate. A relay substrate 5 having high dimensional precision can thus be readily produced by using wet etching. The Z cut quartz crystal plate includes a quartz crystal plate so cut that the principal plane thereof is a plane perpendicular to the axis Z and rotated around at least one of the axes X and Y by an angle ranging from 0 to 10 degrees.

Vibrator

The vibrator 6 is an element that excites thickness-shear vibration. The vibrator 6 includes a quartz crystal substrate

61, a pair of excitation electrodes (not shown) disposed on opposite surfaces of the quartz crystal substrate 61, and a pair of pad electrodes (not shown) disposed on one of the surfaces (upper surface) of the quartz crystal substrate 61 and electrically connected to the pair of excitation electrodes. In the vibrator 6, when periodically changing voltage is applied across the pair of excitation electrodes via the pair of pad electrodes, thickness-shear vibration is excited at a desired frequency in a predetermined portion of the quartz crystal substrate 61.

Quartz crystal belongs to the trigonal system and has the axes X, Y, and Z perpendicular to one another as the crystal axes. The axes X, Y, and Z are called the electrical axis, the mechanical axis, and the optical axis, respectively. The quartz crystal substrate 61 is a "rotated Y cut quartz crystal substrate" cut along a plane that is a plane XZ (plane perpendicular to axis Y) rotated around the axis X by a predetermined angle $\theta$. An AT cut quartz crystal substrate, which is a rotated Y cut quartz crystal substrate rotated by $\theta=35°15'$, is used as a quartz crystal substrate 61 to form a vibrator 6 having excellent temperature characteristics. The quartz crystal substrate 61 is not limited to an AT cut quartz crystal substrate and may, for example, be a BT cut or SC cut quartz crystal substrate that allows excitation of thickness-shear vibration.

The quartz crystal substrate 61 has an oblong shape having a longitudinal direction that coincides with the direction $\alpha$ in the plan view. The shape of the vibrator 6 in the plan view is not limited to the shape described above and may, for example, be a circular shape or a rectangular shape with at least one corner chamfered. The vibrator 6 has a fixed thickness in the drawings, but not necessarily, and may, for example, be a mesa-type or inverse mesa-type vibrator.

The excitation electrodes and the pad electrodes used in the vibrator 6 can be made of a known electrode material and do not necessarily made of a specific material. The excitation electrodes and the pad electrodes may each be a metal coating formed of a ground layer which is made, for example, of Cr (chromium) or Ni (nickel) and on which an alloy layer made of Au (gold), Al (aluminum), or any other metal or an alloy primarily made of Au or Al is layered.

One end portion of the thus configured vibrator 6 in the direction $\alpha$ (right end portion in FIG. 4) is joined to the third section 53 of the relay substrate 5 described above via two metal bumps 9. The two metal bumps 9 are connected to the two pad electrodes on the vibrator 6. The metal bumps 9 only need to electrically connect the circuit component 4 to the vibrator 6 via the relay substrate 5, and the arrangement of the metal bumps 9 is not limited to the arrangement shown in FIG. 4. For example, two metal bumps 9 may be disposed at two corners of the vibrator 6 that face each other or may both be disposed at one corner of the vibrator 6, or four metal bumps 9 may be disposed at the four corners of the vibrator 6.

Metal Bumps

The metal bumps 7 (first metal bump) join the base 2 (package 10) and the circuit component 4 to each other. Heat can thus be smoothly transferred between the base 2 and the circuit component 4. As a result, the difference in temperature between the base 2 and the circuit component 4 can be reduced. The metal bumps 8 (second metal bump) join the circuit component 4 and the relay substrate 5 to each other. Heat can thus be smoothly transferred between the circuit component 4 and the relay substrate 5. As a result, the difference in temperature between the circuit component 4 and the relay substrate 5 can be reduced. The metal bumps 9 (third metal bump) join the relay substrate 5 and vibrator 6 to each other. Heat can thus be smoothly transferred between the relay substrate 5 and the vibrator 6. As a result, the difference in temperature between the relay substrate 5 and the vibrator 6 can be reduced.

The metal bumps 7, 8, and 9 each have a circular shape in the plan view. The metal bumps 7, 8, and 9 each do not necessarily have the shape shown in the drawings and may, for example, have a circular columnar shape, a polygonal columnar shape, or a truncated conical shape. The metal bumps 7, 8, and 9 are not each necessarily made of a specific material and may, for example, be made of gold (Au), silver (Ag), copper (Cu), aluminum (Al), platinum (Pt), or any other metal, or an alloy thereof, lead-free solder, and lead-containing solder. The metal bumps 7, 8, and 9 can be formed, for example, by using plating or bonding, and the joining with the bumps can be performed based on pressure welding, heating and pressure welding, or heated pressure welding with the aid of an ultrasonic wave.

The thus configured vibration device 1 includes the vibrator 6, the circuit component 4, the relay substrate 5 disposed between the vibrator 6 and the circuit component 4, the package 10, which accommodates the vibrator 6, the circuit component 4, and the relay substrate 5, the metal bumps 7, which form the first metal bump that joins the circuit component 4 to the package 10, the metal bumps 8, which form the second metal bump that joins the circuit component 4 to the relay substrate 5, and the metal bumps 9, which form the third metal bump that joins the relay substrate 5 to the vibrator 6.

According to the thus configured vibration device 1, the vibrator 6 and the circuit component 4 can be incorporated in the package 10 with use of no resin material but use of the metal bumps 7, 8, and 9. Therefore, even in a case where the package 10 is sealed and then undergoes a heat treatment, a problem of a gas produced from a resin material (outgassing) in the package 10 can be solved. Further, since the vibrator 6 is supported by the circuit component 4 via the relay substrate 5, the stress induced in the vibrator 6 can be reduced even in the situation in which the metal bumps are used.

In the present embodiment, the metal bumps 8 (second metal bump) do not overlap with the metal bumps 7 (first metal bump) when viewed in the thickness direction of the relay substrate 5 (direction $\gamma$). The stress induced in the vibrator 6 can therefore be further reduced.

The metal bumps 8 (second metal bump) do not overlap with the metal bumps 9 (third metal bump) when viewed in the thickness direction of the relay substrate 5 (direction $\gamma$). The stress induced in the vibrator 6 can therefore be further reduced.

The metal bumps 7 (first metal bump) and the metal bumps 8 (second metal bump) are preferably each disposed on the active surface of the circuit component 4. The configuration described above eliminates the need to provide the circuit component 4 with Si pass-through electrodes or any other structure, whereby the cost of the circuit component 4 can be reduced.

The metal bumps 8 (second metal bump) are disposed on one surface of the relay substrate 5, and the metal bumps 9 (third metal bump) are disposed on the other surface of the relay substrate 5. Therefore, when the relay substrate 5 and the vibrator 6 are incorporated in the package 10, the relay substrate 5 and the vibrator 6 can be layered on the same side of the circuit component 4, whereby the circuit component 4, the relay substrate 5, and the vibrator 6 can be readily incorporated in the package 10, which is an advantage provided by the present embodiment.

The relay substrate 5 includes the frame-shaped first section 51, the frame-shaped second section 52, which is disposed inside the first section 51, the third section 53, which is disposed inside the second section 52, the first beam sections 54, which support the second section 52 pivotally around the first axis β1 relative to the first section 51, and the second beam sections 55, which support the third section 53 pivotally around the second axis α1, which intersects the first axis β1, relative to the second section 52. The metal bumps 8 (second metal bump) are disposed on the first section 51. The metal bumps 9 (third metal bump) are disposed on the third section 53. The stress induced in the vibrator 6 can therefore be further reduced. Further, the vibration from the package 10 is unlikely to be transmitted to the vibrator 6. As a result, the anti-vibration characteristics of the vibration device 1 can also be improved. The relay substrate 5 shown in FIG. 5 also provides the same effects.

The above-mentioned embodiment has been described with reference to the case where the metal bumps 8 (second metal bump) are disposed on the first section 51 of the relay substrate 5. The same effects can be provided also in a case where the metal bumps 8 (second metal bump) are disposed on the third section 53. In this case, the metal bumps 8 are preferably disposed at the center of the third section 53.

Second Embodiment

A second embodiment of the invention will next be described.

Figure 7:
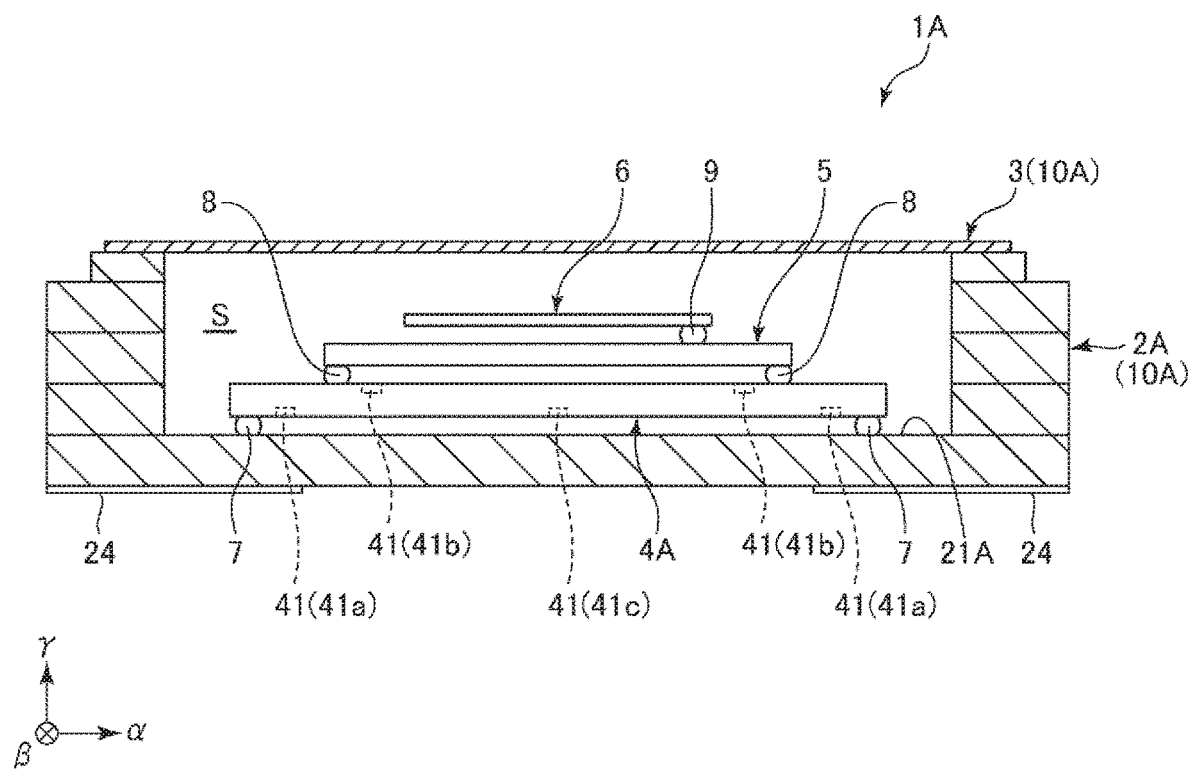
FIG. 7 is a longitudinal cross-sectional view (cross-sectional view taken along plane αγ) showing a vibration device (oscillator) according to a second embodiment of the invention.

FIG. 7 is a longitudinal cross-sectional view (cross-sectional view taken along plane αγ) showing a vibration device (oscillator) according to a second embodiment of the invention.

A vibration device according to the second embodiment will be described below primarily about differences from the vibration device according to the first embodiment described above, and the same items will not be described.

The vibration device according to the second embodiment of the invention is the same as the vibration device according to the first embodiment described above except that the circuit component, the relay substrate, and the vibrator are layered on each other in the presented order from the side facing the base of the package toward the side facing the lid thereof.

A vibration device 1A shown in FIG. 7 includes a base 2A (base element), the lid 3, a circuit component 4A, the relay substrate 5, the vibrator 6, and the metal bumps 7, 8, and 9.

The lid 3 closes the opening of a recessed section 21A of the base 2A, and the base 2A and the lid 3 form a package 10A having the space S, which accommodates the circuit component 4A, the relay substrate 5, and the vibrator 6. In the space S in the package 10A, the circuit component 4A, the relay substrate 5, and the vibrator 6 are arranged (layered on each other) in the presented order from the −γ-direction side toward the +γ-direction side.

The metal bumps 7 (first metal bump) join the base 2A and the circuit component 4A to each other, and the circuit component 4A is supported by the base 2A via the metal bumps 7. The metal bumps 8 (second metal bump) join the circuit component 4A and the relay substrate 5 to each other, and the relay substrate 5 is supported by the circuit component 4A via the metal bumps 8. The metal bumps 9 (third metal bump) join the relay substrate 5 and the vibrator 6 to each other, and the vibrator 6 is supported by the relay substrate 5 via the metal bumps 9.

Although not shown, the lower surface of the circuit component 4A is provided with terminals to which the metal bumps 7 are joined. On the other hand, the upper surface of the circuit component 4A is provided with terminals to which the metal bumps 8 are joined. The circuit component 4A is provided with Si pass-through electrodes or any other electrodes for conduction between the opposite surfaces of the circuit component 4A.

The circuit component 4A includes a plurality of temperature sensors 41. The plurality of temperature sensors 41 include a plurality of temperature sensors 41a and a temperature sensor 41c disposed on the lower surface (active surface) of the circuit component 4A and a plurality of temperature sensors 41b disposed on the upper surface of the circuit component 4A. The plurality of temperature sensors 41a are provided in correspondence with the plurality of metal bumps 7, as in the first embodiment described above. The plurality of temperature sensors 41b are provided in correspondence with the plurality of metal bumps 8. The temperature sensor 41c is disposed in a central portion of the circuit component 4A in the plan view. It is, however, noted in the present embodiment that the plurality of temperature sensors 41b are disposed on the side opposite the active surface of the circuit component 4A, and that the temperature sensor 41c is disposed on the active surface of the circuit component 4A.

According to the second embodiment described above, the vibrator 6 and the circuit component 4A can be incorporated in the package 10A with use of no resin material but use of the metal bumps 7, 8, and 9, as in the first embodiment described above. Therefore, even in a case where the package 10A is sealed and then undergoes a heat treatment, the problem of a gas produced from a resin material (outgassing) in the package 10A can be solved. Further, since the vibrator 6 is supported by the circuit component 4A via the relay substrate 5, the stress induced in the vibrator 6 can be reduced even in the situation in which the metal bumps are used.

Further, in the vibration device 1A, the metal bumps 7 (first metal bump) and the metal bumps 8 (second metal bump) are so disposed that metal bumps out of the two types of metal bumps (metal bumps 7 in the present embodiment) are disposed on the active surface of the circuit component 4A and the other metal bumps (metal bumps 8 in the present embodiment) are disposed on the side opposite the active surface of the circuit component 4A. Therefore, when the circuit component 4A and the relay substrate 5 are incorporated in the package 10A, the circuit component 4A and the relay substrate 5 can be layered on each other on the same side, whereby the circuit component 4A and the relay substrate 5 can be readily incorporated in the package 10A, which is an advantage provided by the present embodiment.

2. Electronic Apparatus

An electronic apparatus according to an embodiment of the invention will next be described.

Figure 8:
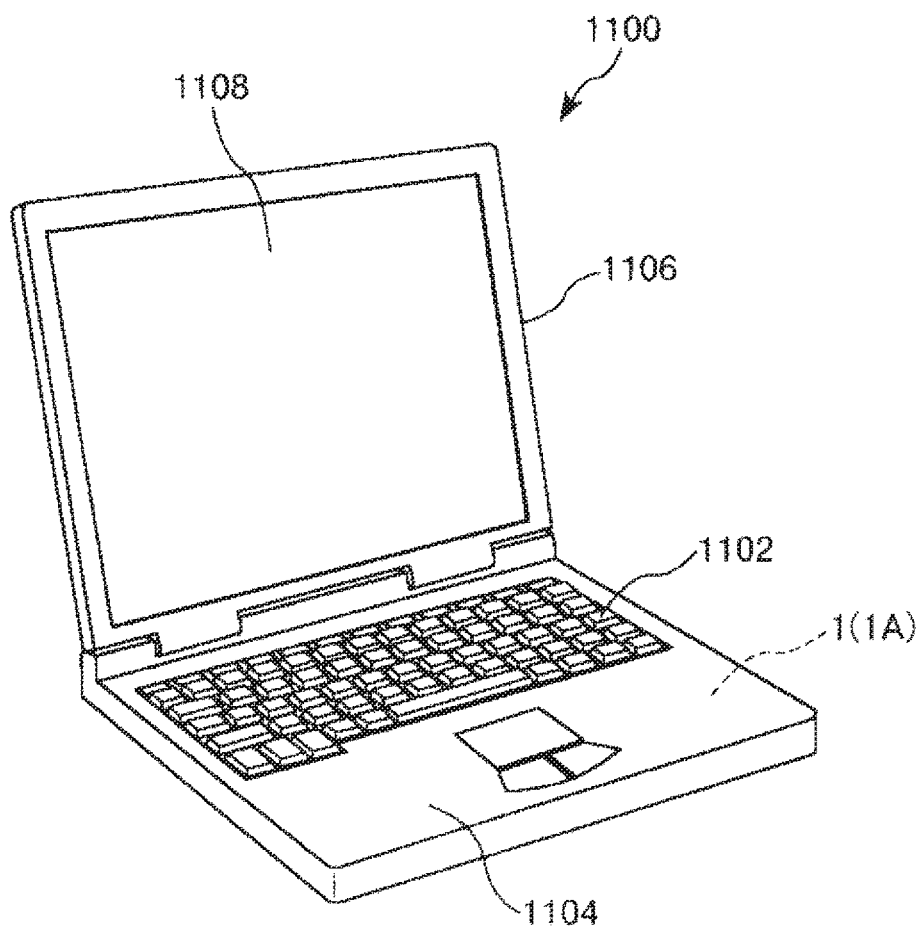
FIG. 8 is a perspective view showing the configuration of a mobile (or notebook) personal computer as an example of an electronic apparatus according to an embodiment of the invention.

FIG. 8 is a perspective view showing the configuration of a mobile (or notebook) personal computer as an example of the electronic apparatus according to the embodiment of the invention. In FIG. 8, a personal computer 1100 is formed of a main body 1104 including a keyboard 1102 and a display unit 1106 including a display section 1108, and the display unit 1106 is swingably supported by the main body 1104 via a hinge structure. The thus configured personal computer 1100 accommodates the vibration device 1 (or 1A), which functions as a filter, a resonator, a reference clock, or any other component.

Figure 9:
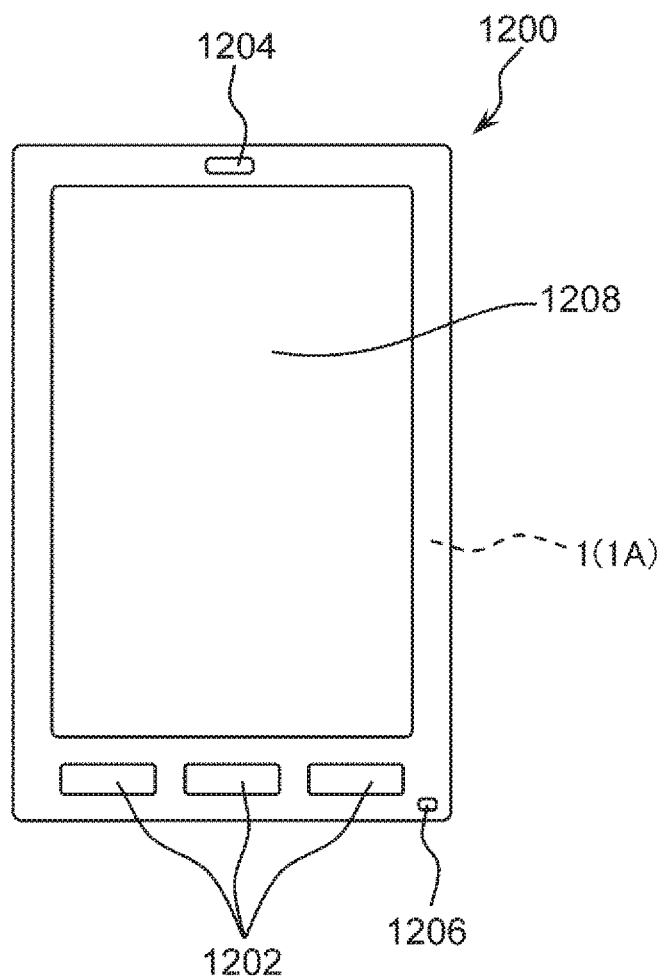
FIG. 9 is a perspective view showing the configuration of a smartphone as an example of the electronic apparatus according to the embodiment of the invention.

FIG. 9 is a perspective view showing the configuration of a smartphone as an example of the electronic apparatus according to the embodiment of the invention. In FIG. 9, a mobile phone 1200 includes a plurality of operation buttons 1202, a receiver 1204, and a transmitter 1206, and a display section 1208 is disposed between the operation buttons 1202 and the receiver 1204. The thus configured mobile phone 1200 accommodates the vibration device 1 (or 1A), which functions as a filter, a resonator, or any other component.

Figure 10:
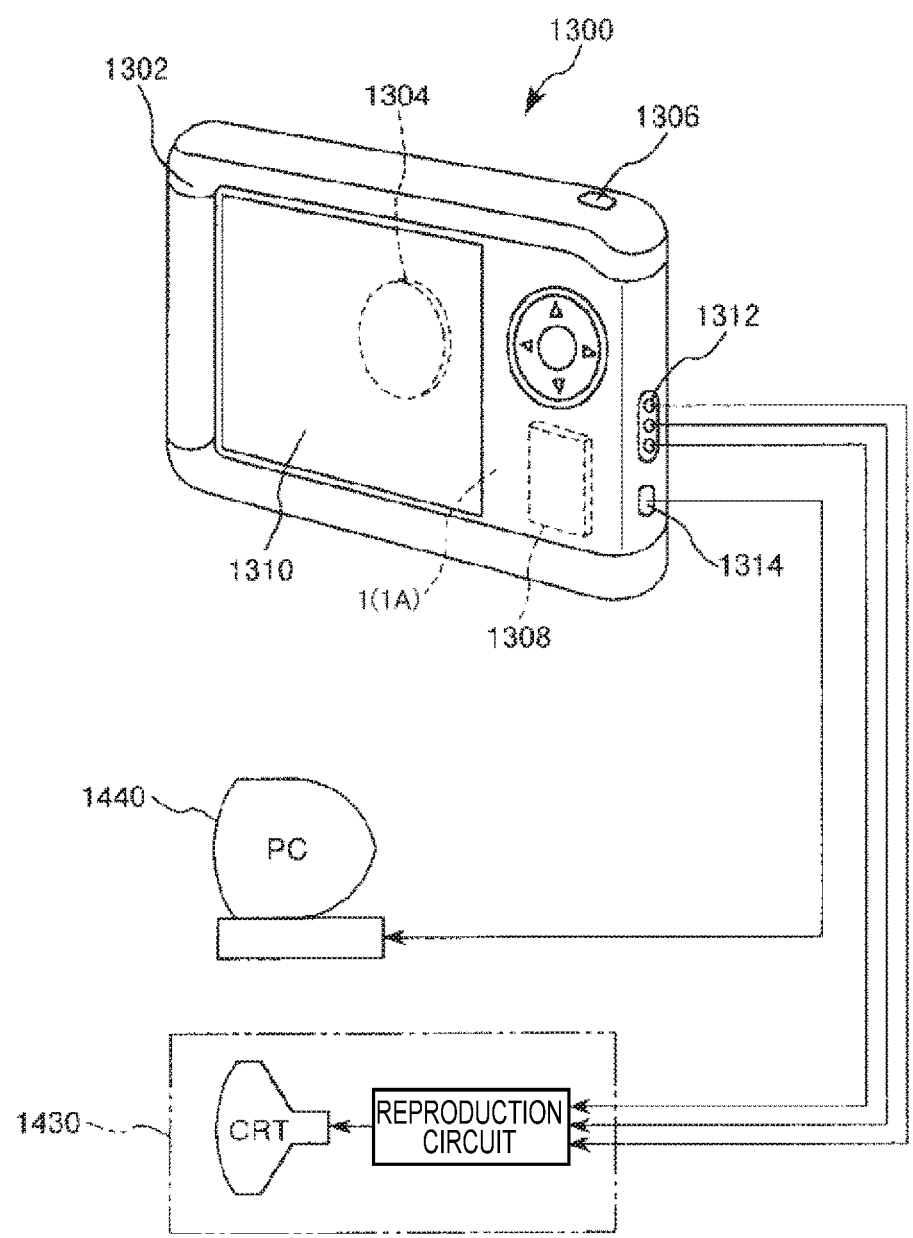
FIG. 10 is a perspective view showing the configuration of a digital still camera as an example of the electronic apparatus according to the embodiment of the invention.

FIG. 10 is a perspective view showing the configuration of a digital still camera as an example of the electronic apparatus according to the embodiment of the invention. FIG. 10 also shows connection to an external apparatus in a simplified manner. A display section 1310 is provided on the rear side of an enclosure (body) 1302 of a digital still camera 1300 and displays an image based on a captured image signal from a CCD. The display section 1310 thus functions as a finder that displays a subject in the form of an electronic image. Further, a light receiving unit 1304 including an optical lens (imaging system), the CCD, and other components is provided on the front side (rear side in FIG. 10) of the enclosure 1302.

When a user of the camera checks the subject image displayed on the display section 1310 and presses a shutter button 1306, a captured image signal from the CCD at that point of time is transferred to and stored in a memory 1308. Further, in the digital still camera 1300, a video signal output terminal 1312 and a data communication input/output terminal 1314 are provided on a side surface of the enclosure 1302. A television monitor 1430 is connected to the video signal output terminal 1312 as necessary, and a personal computer 1440 is connected to the data communication input/output terminal 1314 as necessary, as shown in FIG. 10. Further, in response to predetermined operation, the captured image signal stored in the memory 1308 is outputted to the television monitor 1430 or the personal computer 1440. The thus configured digital still camera 1300 accommodates the vibration device 1 (or 1A), which functions as a filter, a resonator, or any other component.

The electronic apparatuses described above each include the vibration device 1 or 1A. The electronic apparatuses described above can use the excellent characteristics of the vibration device 1 or 1A to improve the characteristics of the electronic apparatus.

An electronic apparatus including the vibrator according to the embodiment of the invention is not limited to the personal computer (mobile personal computer) shown in FIG. 8, the smartphone (mobile phone) shown in FIG. 9, and the digital still camera shown in FIG. 10 and may, for example, be a timepiece, a tablet terminal, an inkjet-type liquid ejection apparatus (inkjet printer, for example), a laptop personal computer, a television receiver, a video camcorder, a video tape recorder, a car navigator, a pager, an electronic notepad (including electronic notepad having communication capability), an electronic dictionary, a desktop calculator, an electronic game console, a word processor, a workstation, a TV phone, a security television monitor, electronic binoculars, a POS terminal, a medical apparatus (such as electronic thermometer, blood pressure gauge, blood sugar meter, electrocardiograph, ultrasonic diagnostic apparatus, and electronic endoscope), a fish finder, a variety of measuring apparatus, a variety of instruments (such as instruments in car, airplane, and ship), and a flight simulator.

5. Vehicle

A vehicle that uses the vibration device according to the embodiment of the invention (vehicle according to an embodiment of the invention) will next be described.

Figure 11:
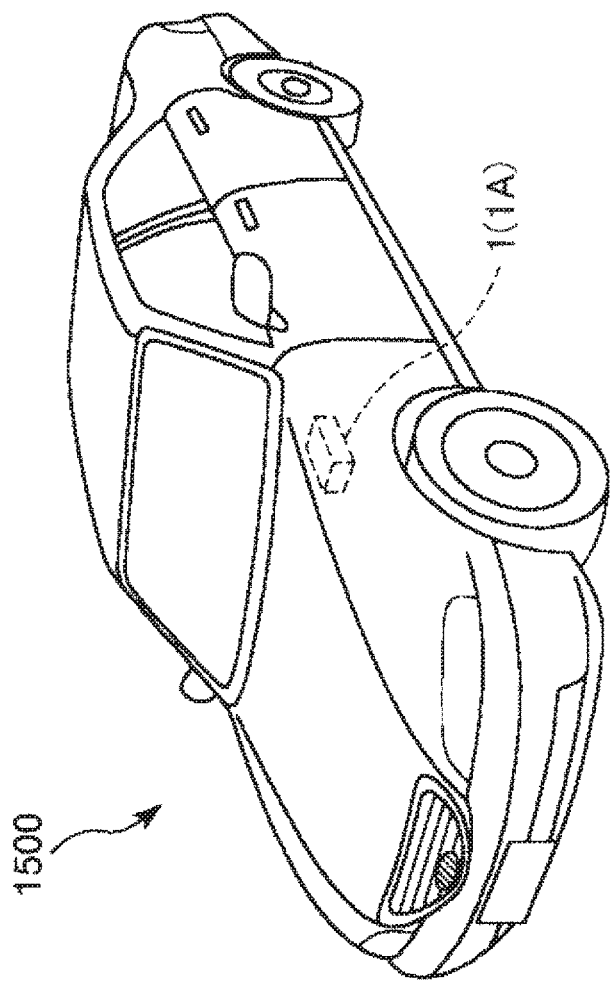
FIG. 11 is a perspective view showing an automobile as an example of a vehicle according to an embodiment of the invention.

FIG. 11 is a perspective view showing an automobile as an example of the vehicle according to the embodiment of the invention. An automobile 1500 accommodates the vibration device 1 (or 1A). The vibration device 1 or 1A can be widely used as a keyless entry system, an immobilizer, a car navigation system, a car air conditioner, an antilock brake system (ABS), an airbag, a tire pressure monitoring system (TPMS), an engine control system, an apparatus that monitors a battery in a hybrid automobile and an electric automobile, a car body attitude control system, and other electronic control units (ECUs).

The automobile 1500 described above, which is the vehicle, includes the vibration device 1 or 1A. The vehicle 1500 described above can use the excellent characteristics of the vibration device 1 or 1A to improve the characteristics of the vehicle 1500.

The vibration devices, the electronic apparatuses, and the vehicle according to the embodiments of the invention have been described above with reference to the drawings, but the invention is not limited to the embodiments, and the configuration of each portion of the vibration devices, the electronic apparatuses, and the vehicle can be replaced with a portion having an arbitrary configuration having the same function. Further, an arbitrarily constituent part may be added to the vibration devices, the electronic apparatuses, and the vehicle. Moreover, the embodiments described above can be combined with each other as appropriate.

In the embodiments described above, a quartz crystal substrate is used as a piezoelectric substrate. The quartz crystal substrate may be replaced, for example, with any of a variety of other piezoelectric substrates made, for example, of lithium niobate or lithium tantalate.

The above-mentioned embodiments have been described with reference to the case where the vibrator is an element that vibrates in the form of thickness-shear vibration, but not necessarily in the invention. For example, the vibrator may instead be a tuning fork type vibrator. Further, the above-mentioned embodiments have been described with reference to the case where the vibration device is an oscillator, but not necessarily in the invention. The invention is also applicable, for example, to a gyro sensor.

The entire disclosure of Japanese Patent Application No. 2017-228725, filed Nov. 29, 2017 is expressly incorporated by reference herein.

What is claimed is:

1. A vibration device comprising:
a vibrator;
a circuit component;
a relay substrate disposed between the vibrator and the circuit component;
a package that accommodates the vibrator, the circuit component, and the relay substrate;
a first metal bump that joins the circuit component to the package;
a second metal bump that joins the relay substrate to the circuit component; and
a third metal bump that joins the vibrator to the relay substrate.

2. The vibration device according to claim 1, wherein the second metal bump does not overlap with the first metal bump when viewed in a thickness direction of the relay substrate.

3. The vibration device according to claim 1, wherein the second metal bump does not overlap with the third metal bump when viewed in a thickness direction of the relay substrate.

4. The vibration device according to claim 1, wherein the first and second metal bumps are arranged at an active surface of the circuit component.

5. The vibration device according to claim 1, wherein the first and second metal bumps are so disposed that one of the metal bumps is arranged at an active surface of the circuit component and the other is arranged at a surface opposite from the active surface of the circuit component.

6. The vibration device according to claim 1,
wherein the second metal bump is disposed on one surface of the relay substrate, and
the third metal bump is disposed on another surface of the relay substrate.

7. The vibration device according to claim 1,
wherein the relay substrate includes
a frame-shaped first section,
a third section disposed inside the first section, and
a first beam section that supports the third section pivotally around a first axis relative to the first section,
the second metal bump is disposed on the first section, and
the third metal bump is disposed on the third section.

8. The vibration device according to claim 1,
wherein the relay substrate includes
a frame-shaped first section,
a frame-shaped second section disposed inside the first section,
a third section disposed inside the second section, and
a first beam section that supports the second section pivotally around a first axis relative to the first section, and
a second beam section that supports the third section pivotally around a second axis that intersects the first axis relative to the second section,
the second metal bump is disposed on the first section, and
the third metal bump is disposed on the third section.

9. An electronic apparatus comprising the vibration device according to claim 1.

10. A vehicle comprising the vibration device according to claim 1.

\* \* \* \* \*